(12) United States Patent
Yoshidome et al.

(10) Patent No.: US 9,831,075 B2
(45) Date of Patent: Nov. 28, 2017

(54) SOURCE MAGNET FOR IMPROVED RESPUTTERING UNIFORMITY IN DIRECT CURRENT (DC) PHYSICAL VAPOR DEPOSITION (PVD) PROCESSES

(71) Applicant: APPLIED MATERIALS, INC., Santa Clara, CA (US)

(72) Inventors: Goichi Yoshidome, Albany, CA (US); Fuhong Zhang, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 90 days.

(21) Appl. No.: 14/483,909

(22) Filed: Sep. 11, 2014

(65) Prior Publication Data

US 2015/0075982 A1 Mar. 19, 2015

Related U.S. Application Data

(60) Provisional application No. 61/879,105, filed on Sep. 17, 2013.

(51) Int. Cl.
*C23C 14/35* (2006.01)
*H01J 37/34* (2006.01)
*H01F 7/02* (2006.01)

(52) U.S. Cl.
CPC .......... *H01J 37/3455* (2013.01); *C23C 14/35* (2013.01); *H01F 7/0273* (2013.01); *H01J 37/3452* (2013.01)

(58) Field of Classification Search
CPC .. C23C 14/351; H01F 7/0273; H01J 37/3452; H01J 37/3455
USPC ...................................... 204/298.2
See application file for complete search history.

(56) References Cited

U.S. PATENT DOCUMENTS

| 6,440,282 B1 | 8/2002 | Wada et al. |
| 7,186,319 B2 | 3/2007 | Yang et al. |
| 7,736,473 B2 | 6/2010 | Miller et al. |
| 7,767,064 B2 | 8/2010 | Pavloff et al. |
| 8,557,094 B2 | 10/2013 | Tang et al. |

(Continued)

FOREIGN PATENT DOCUMENTS

JP 05-001373 * 1/1993

OTHER PUBLICATIONS

International Search Report and Written Opinion dated Mar. 15, 2012 for PCT Application No. PCT/US2011/045644.
Search Report Taiwan Invention Patent Application No. 100126642.

*Primary Examiner* — Rodney McDonald
(74) *Attorney, Agent, or Firm* — Moser Taboada; Alan Taboada

(57) ABSTRACT

A magnetic field forming apparatus includes a support member having a first side and a second side coupling a first end to a second end and an axis of rotation between the first end and the second end; a first body coupled to the first end of the support member and extending away from the first side of the support member, wherein the first body has a plurality of first magnets coupled to a bottom of the first body; a second body rotatably coupled to the second end of the support member and extending away from the second side of the support member, wherein the second body has a plurality of second magnets coupled to a bottom of the second body, wherein the plurality of the first magnets are disposed about 180 degrees from the plurality of second magnets with respect to the axis of rotation of the support member.

20 Claims, 3 Drawing Sheets

(56) References Cited

U.S. PATENT DOCUMENTS

| | | |
|---|---|---|
| 2006/0070876 A1 | 4/2006 | Wu et al. |
| 2008/0083610 A1* | 4/2008 | Tang .................. C23C 14/0641 |
| | | 204/192.1 |
| 2010/0105203 A1 | 4/2010 | Fu et al. |
| 2011/0311735 A1 | 12/2011 | Wang et al. |
| 2012/0024229 A1 | 2/2012 | Liu et al. |
| 2012/0027954 A1 | 2/2012 | Liu et al. |

* cited by examiner ically lead to non-uniform etch and resputter rations, which can lead to uneven deposition across the substrate.

SOURCE MAGNET FOR IMPROVED RESPUTTERING UNIFORMITY IN DIRECT CURRENT (DC) PHYSICAL VAPOR DEPOSITION (PVD) PROCESSES

CROSS-REFERENCE TO RELATED APPLICATIONS

This application claims benefit of U.S. provisional patent application Ser. No. 61/879,105, filed Sep. 17, 2013, which is herein incorporated by reference in its entirety.

FIELD

Embodiments of the present disclosure generally relate to substrate processing, and more specifically to physical vapor deposition processes.

BACKGROUND

The inventors have observed that, in conventional physical vapor deposition (PVD) processes, for example for tantalum (Ta) deposition, a single deposition magnet can lead to non-uniform etch and resputter ratios due to the confinement of the plasma near the target.

Thus, the inventors have provided apparatus and methods for PVD deposition of films having uniform etch and resputter ratios.

SUMMARY

Methods and apparatus for forming a magnetic field within a process chamber are provided herein. In some embodiments, an apparatus for forming a magnetic field within a process chamber includes: a support member having a first side and a second side coupling a first end to a second end and an axis of rotation between the first end and the second end; a first body coupled to the first end of the support member and extending away from the first side of the support member, wherein the first body has a plurality of first magnets coupled to a bottom of the first body; and a second body rotatably coupled to the second end of the support member and extending away from the second side of the support member, wherein the second body has a plurality of second magnets coupled to a bottom of the second body, and wherein the plurality of the first magnets are disposed about 180 degrees from the plurality of second magnets with respect to the axis of rotation of the support member.

In some embodiments, a process chamber includes: a chamber body defining a processing volume; a target assembly disposed atop the chamber body, the target assembly having a source distribution plate opposing a back surface of a target and electrically coupled to the target along a peripheral edge of the target; and a rotatable magnetron disposed within the target assembly and proximate the back surface of the target, the rotatable magnetron comprising a support member having a first side and a second side coupling a first end to a second end and an axis of rotation between the first end and the second end; a first body coupled to the first end of the support member and extending away from the first side of the support member, wherein the first body has a plurality of first magnets coupled to a bottom of the first body; and a second body rotatably coupled to the second end of the support member and extending away from the second side of the support member, wherein the second body has a plurality of second magnets coupled to a bottom of the second body, and wherein the plurality of the first magnets are disposed about 180 degrees from the plurality of second magnets with respect to the axis of rotation of the support member.

In some embodiments, an apparatus for forming a magnetic field within a process chamber includes: a support member having a first side and a second side coupling a first end to a second end and an axis of rotation between the first end and the second end; a first body coupled to the first end of the support member and extending away from the first side of the support member, wherein the first body comprises a counterweight and comprises a plurality of first magnets arranged in an array and coupled to a bottom of the first body; and a second body rotatably coupled to the second end of the support member and extending away from the second side of the support member, wherein the second body has a plurality of second magnets coupled to a bottom of the second body, and wherein the plurality of the first magnets are disposed about 180 degrees from the plurality of second magnets with respect to the axis of rotation of the support member, and wherein the plurality of second magnets comprises an outer closed loop magnetic pole, an inner closed loop magnetic pole, and a central closed loop magnetic pole, and wherein the outer closed loop magnetic pole circumscribes the inner closed loop magnetic pole and wherein the inner closed loop magnetic pole circumscribes the central closed loop magnet pole.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
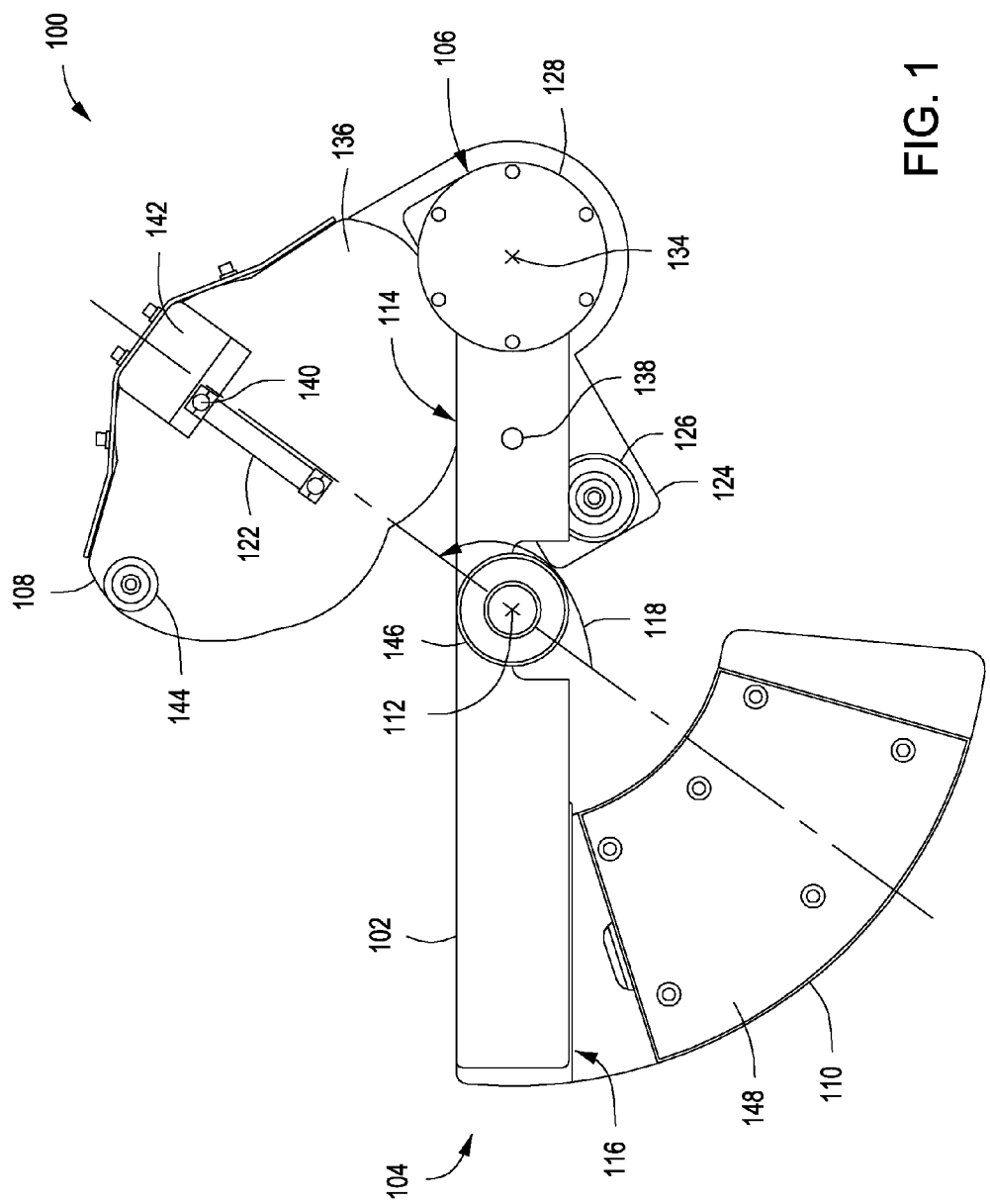
FIG. 1 is a top view of an apparatus for forming a magnetic field in a process chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an apparatus for forming a magnetic field within a process chamber are provided herein. In some embodiments, apparatus for forming a magnetic field in accordance with the present disclosure advantageously provide improved resputter uniformity and improved etch rate uniformity.

Figure 2:
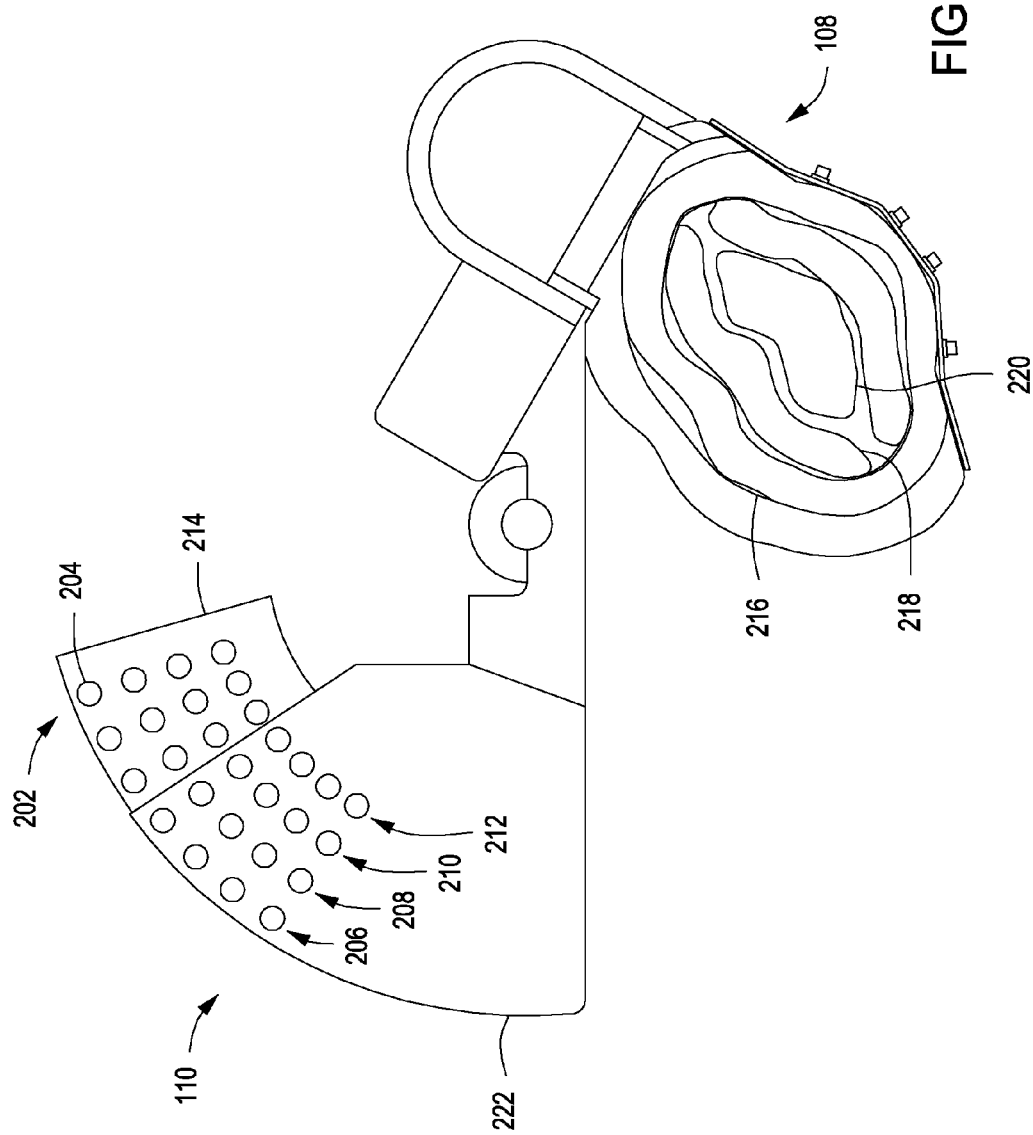
FIG. 2 is a bottom view of an apparatus for forming a magnetic field in a process chamber in accordance with some embodiments of the present disclosure.

FIG. 1 and FIG. 2 respectively provide a top view and a bottom view, respectively, of an apparatus for forming a magnetic field, e.g., a magnetron 100, in a process chamber in accordance with some embodiments of the present disclosure.

In some embodiments, the magnetron 100 may be used in any suitable physical vapor deposition process chamber, for example the process chamber 300 described below with respect to FIG. 3. The magnetron 100 comprises a support member 102, a first body 110 and a second body 108. The support member 102 comprises a first side 114 and an opposing second side 116, and a first end 104 and an opposing second end 106. The support member 102 may be constructed from any material suitable to provide adequate mechanical strength to rigidly support the first body 110 and second body 108. For example, in some embodiments, the support member 102 may be constructed from a non-magnetic metal, such as non-magnetic stainless steel. The support member 102 may have any shape suitable to allow the first body 110 and second body 108 to be coupled thereto in a desired position. For example, in some embodiments, the support member 102 may comprise a plate, a disk, a cross member, or the like. The support member 102 comprises an axis of rotation 112 between the first end 104 and the second end 106. The magnetron 100 rotates 360 degrees about the axis of rotation 112 as described below with respect to the process chamber 300.

The first body 110 is coupled to the first end 104 of the support member 102. In some embodiments, such as when the support member is a rectangular plate, the first body extends away from the first side 114 of the support member 102. As depicted in FIG. 2, the first body 110 has a plurality of first magnets coupled to the bottom of the first body 110. The plurality of first magnets are configured to produce a first magnetic field within the process chamber 300. In some embodiments, the first body 110 comprises a counterweight 222 disposed between the plurality of first magnets and the support member 102. The counterweight 222 is designed to have the same moment of inertia as the second body 108 and associated elements to reduce vibration during rotation.

The plurality of first magnets are arranged in an array 202. In some embodiments, the array 202 comprises a plurality of holes 204 within the first body 110. In some embodiments, the first body 110 comprises an extension 214 coupled to the counterweight 222 and comprising additional holes 204. In some embodiments, the plurality of holes 204 holds the plurality of first magnets between a shunt plate 148, as depicted in FIG. 1, and a pole plate (not shown) coupled to the bottom of the first body 110. In some embodiments, the plurality of holes are arranged in a first row 206, a second row 208, a third row 210, and a fourth row 212. In some embodiments, the first body 110 may comprise more or less than four rows depending on the size of the first body 110. In some embodiments, each row 206, 208, 210, and 212 comprises seven columns. In some embodiments, each row 206, 208, 210, and 212 may comprise more or less than seven columns depending on the size of the first body 110. In some embodiments, some or all of the plurality of holes 204 may contain a first magnet. For example, in the embodiment depicted in FIG. 2, each of the first row 206, second row 208, third row 210 and fourth row 212 comprise seven holes 204, with each hole 204 having a first magnet partially disposed therein. In some embodiments, the array 202 comprises a first row having seven magnets and a second row having four magnets. In some embodiments, the plurality of first magnets is arranged in the holes 204 such that the north pole of each first magnet faces a target 310, as described below with respect to process chamber 300. The inventors have observed that when the plurality of first magnets are arranged in the holes 204 such that the north pole of each first magnet faces the target 310, the plurality of first magnets do not interfere with sensors that allow a controller to determine the current radial position of the second body 108.

Returning to FIG. 1, the second body 108 is rotatably coupled to the second end 106 of the support member 102 and extends away from the second side 116 of the support member 102. In some embodiments, the second body 108 is rotatably coupled to the second end 106 of the support member 102 by a rotation bearing 128, although other rotatable coupling techniques may be used. The second body 108 comprises a pivot plate 124 supported beneath the second end 106 of the support member 102 through the rotation bearing 128 that allows the pivot plate 124 to pivot about a pivot axis 134. The pivot plate 124 supports a back plate 136. For structural purposes, the back plate 136 can be considered as part of the pivot plate 124 since they pivot together about the pivot axis 134. A first bushing 138 is affixed to the support member 102 between the axis of rotation 112 and the rotation bearing 128. A second bushing 140 is fixed to a mount 142 on the back plate 136. The two ends of a tension spring (spring 122) are attached to the two bushings 138, 140 (spring 122 shown coupled only to second bushing 140 in FIG. 1). A first stop 126 is coupled to the pivot plate 124 on one side of the support member 102 and a second stop 144 is coupled to the back plate 136 on the other side of the support member 102. The spring 122 biases the side of the back plate 90 with the second stop 144 towards the support member 102 and hence biases the second body 108 toward the axis of rotation 112. However, pivoting in the inward direction is limited by the second stop 144 abutting and engaging the support member 102. On the other hand, rotation of the magnetron 100, as described below with respect to FIG. 3, exerts significant centrifugal force on the second body 108 and associated elements and pushes the side of the back plate 136 with the second stop 144 away from the support member 102 in the radially outward direction away from the axis of rotation 112. However, pivoting in the outward direction is limited by the first stop 126 abutting and engaging the support member 102. The speed of rotation determines whether the inward spring biasing or the outward centrifugal force prevails. The magnetron 100 rotates at a constant but selected radius from the axis of rotation 112 for a large number of 360° revolutions during processing while the pivot plate 124 pivots over less than about 90° in changing from one radial position to another.

Varying the rotation rate of the rotary drive shaft 146 will either cause the centrifugal force to overcome the spring bias force to place the second body 108 at a first, radially outer position or cause the spring bias force to dominate to place the second body 108 at a second, radially inner position. The magnetron position illustrated in FIG. 1 is the "out" position for which the centrifugal force is greater. As the rotary drive shaft 146 rotates in one rotational direction at a rate that is sufficiently high, the centrifugal force on the second body 108 is greater than the spring tension and causes the pivot plate 124 and attached second body 108 to pivot outwardly about the pivot axis 134 from the support member 102 to the illustrated outer position. In contrast, when the rotary drive shaft 146 rotates in the same rotational direction but at a sufficiently lower rate the spring tension is greater than the centrifugal force so that the spring 122 pulls the pivot plate 124 and attached second body 108 to pivot inwardly about the pivot axis 134 towards the support member 102 and to the inner position. The drive shaft 146 continues to rotate the magnetron 100 about the axis of rotation 112 but the radial displacement of the second body 108 from the axis of rotation 112 is greater in the outer position than in the inner position. This positioning advantageously allows the second body 108 to scan different areas of the target when it is at different radial positions.

The second body 108 has a plurality of second magnets coupled to the bottom of the second body 108. The plurality of second magnets are configured to produce a second magnetic field within the process chamber 300. The plurality of second magnets are disposed at an angle 118 of about 180 degrees from the plurality of first magnets with respect to the axis of rotation 112 of the support member 102. In some embodiments, as depicted in FIG. 2, the plurality of second magnets forms three magnetic poles, for example, an outer pole 216, an inner pole 218, and a central pole 220. In some embodiments, each pole may include a plurality of second magnets arranged between a pole plate (not shown) and the back plate 136. Each of the outer, inner, and central poles 216, 218, 220 may form a closed loop magnetic field. As used herein, a closed loop magnetic field refers to a pole having no discrete beginning and end, but instead forms a loop. The polarity within a given pole is the same (e.g., north or south).

Figure 3A:
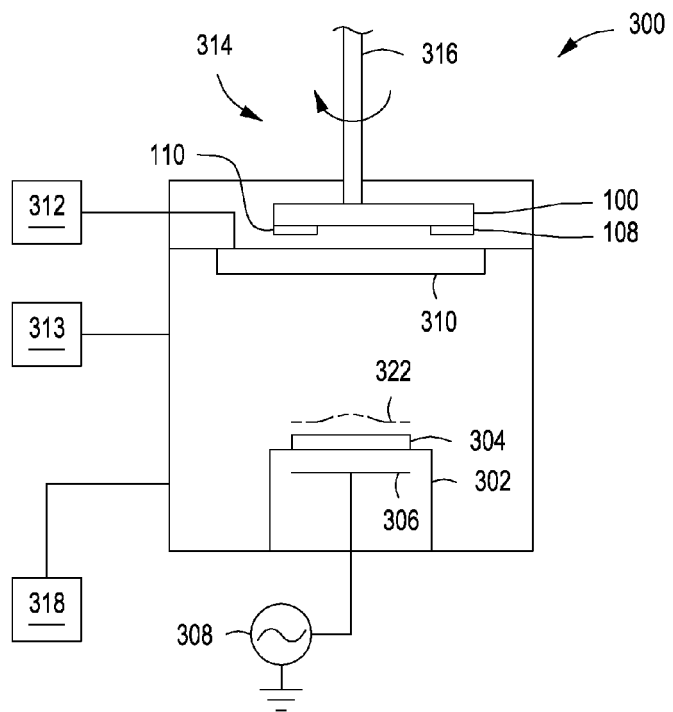
FIG. 3A is a simplified cross-sectional view of a process chamber utilizing an apparatus for forming a magnetic field in a process chamber in accordance with some embodiments of the present disclosure.

FIG. 3A depicts a simplified, cross-sectional view of an illustrative PVD process chamber 300 having an apparatus for forming a magnetic field in accordance with some embodiments of the present disclosure. The specific configuration of the PVD process chamber is illustrative and PVD process chambers having other configurations may also benefit from modification in accordance with the teachings provided herein. Examples of commercially available PVD process chambers suitable for modification in accordance with the teachings provided herein include the ALPS® Plus and SIP ENCORE PVD processing chambers, both commercially available from Applied Materials, Inc., of Santa Clara, Calif. Other processing chambers from Applied Materials, Inc. or other manufacturers may also benefit from modifications in accordance with the inventive apparatus disclosed herein.

In some embodiments, the process chamber 300 may be any suitable PVD chamber configured for DC, and optionally RF, sputtering. In some embodiments, the process chamber 300 may be configured for both DC and RF power application. For example, the process chamber 300 includes a substrate support 302 having a substrate 304 disposed thereon. An electrode 306 may be disposed in the substrate support 302 for providing RF power to the process chamber 300. The RF power may be supplied to the electrode via an RF power supply 308. The RF power supply 308 may be coupled to the electrode 306 via a match network (not shown). Alternatively or in combination, (not shown) the RF power supply 308 (or another RF power supply) may be coupled to a target 310 disposed above the substrate support 302 (or to an electrode disposed proximate a backside of the target), for example, in a ceiling of the process chamber 300.

The target 310 may comprise any suitable metal, metal oxide, metal alloy, magnetic material, or the like for use in depositing a layer on the substrate 304. For example, in some embodiments, the target 310 may comprise tungsten (W). A DC power supply 312 may be coupled to the target 310 to provide a bias voltage on the target 310 to direct a plasma formed in the process chamber 300 towards the target 310. The plasma may be formed from a process gas, such as argon (Ar) or the like, provided to the process chamber 300 by a gas source 313. A magnetron assembly 314 including the magnetron 100 described above and a shaft 316 for rotating the magnetron 100 is disposed above the target 310. The magnetron assembly 314 may, for example, facilitate uniform sputtering of metal atoms from the target 310, and/or uniform deposition of a layer of metal atoms on the substrate 304 having resputter and etch rate uniformity.

A controller 318 may be provided and coupled to various components of the process chamber 300 to control the operation thereof. The controller 318 includes a central processing unit (CPU), a memory, and support circuits. The controller 318 may control the process chamber 300 directly, or via computers (or controllers) associated with particular process chamber and/or support system components. The controller 318 may be one of any form of general-purpose computer processor that can be used in an industrial setting for controlling various chambers and sub-processors. The memory, or computer readable medium, of the controller 318 may be one or more of readily available memory such as random access memory (RAM), read only memory (ROM), floppy disk, hard disk, optical storage media (e.g., compact disc or digital video disc), flash drive, or any other form of digital storage, local or remote. The support circuits are coupled to the CPU for supporting the processor in a conventional manner. These circuits include cache, power supplies, clock circuits, input/output circuitry and subsystems, and the like. Inventive methods as described herein may be stored in the memory as software routine that may be executed or invoked to control the operation of the process chamber 300 in the manner described herein. The software routine may also be stored and/or executed by a second CPU (not shown) that is remotely located from the hardware being controlled by the CPU.

Figure 3B:
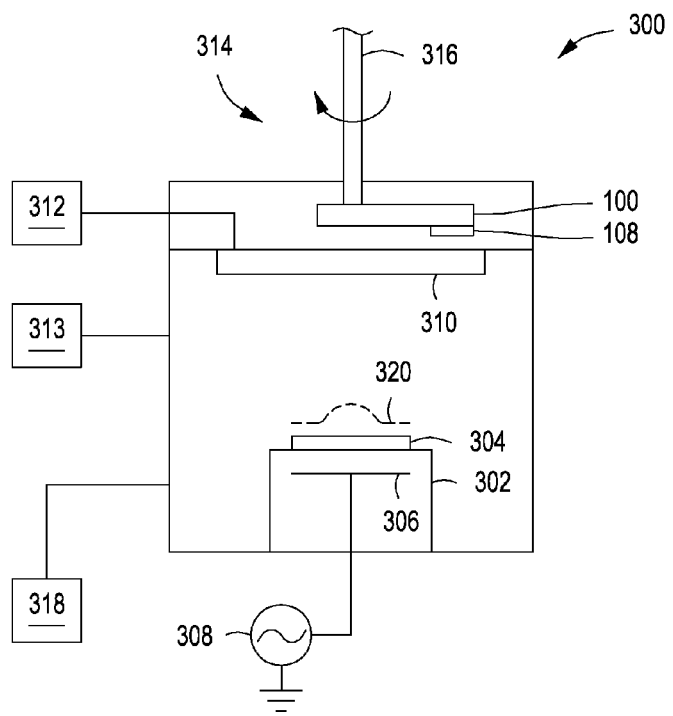
FIG. 3B is simplified cross-sectional view of a process chamber utilizing a conventional apparatus for forming a magnetic field in a process chamber.

In operation, a gas, such as argon (Ar) or the like is provided to the process chamber 300 from the gas source 313. The gas may be provided at a sufficient pressure, such that at least a portion of the gas includes ionized species, such as Ar ions. The ionized species are directed to the target 310 by a DC voltage applied to the target 310 by the DC power supply 312. The ionized species collide with the target 310 to eject metal atoms from the target 310. The metal atoms, for example having a neutral charge fall towards the substrate 304 and deposit on the substrate surface. Concurrently, with the collision of the ionic species with the target 310 and the subsequent ejection of metal atoms, the magnetron 100 is rotated above the target 310 about the shaft 316. The second plurality of magnets in the second body 108 produces a magnetic field within the process chamber 300, generally parallel and close to the surface of the target 310 to trap electrons which can collide with and ionize of any gas molecules proximate the target 310, which in turn increases the local ion species density proximate the surface of the target 310 and increases the sputtering rate. However, as depicted in FIG. 3B, typical process chambers 300 having only a second body 108 with a plurality of second magnets produce a deposition layer having a center high—edge low thickness profile 320. In contrast, as depicted in FIG. 3A, the inventors have observed that an magnetron 100 as described above having a first body 110 with a plurality of first magnets advantageously steers ions near the substrate due to the long magnetic field return lines of the singularly oriented plurality of first magnets resulting in a deposition layer having a uniform thickness profile 322.

While the foregoing is directed to embodiments of the present disclosure, other and further embodiments of the disclosure may be devised without departing from the basic scope thereof.

The invention claimed is:

1. An apparatus for forming a magnetic field within a process chamber, comprising:
    a support member having a first side and a second side coupling a first end to a second end and an axis of rotation between the first end and the second end;
    a first body coupled to the first end of the support member and extending away from the first side of the support member, wherein the first body has a plurality of first magnets coupled to a bottom of the first body, and wherein all magnets coupled to the first body are disposed on the first side of the support member; and
    a second body rotatably coupled to the second end of the support member and extending away from the second side of the support member, wherein the second body has a plurality of second magnets coupled to a bottom of the second body, and wherein the plurality of the first magnets are disposed about 180 degrees from the plurality of second magnets with respect to the axis of rotation of the support member, and wherein the axis of rotation is disposed between the first body and the second body.

2. The apparatus of claim 1, wherein the plurality of second magnets comprises an outer closed loop magnetic pole, an inner closed loop magnetic pole, and a central closed loop magnetic pole, wherein the outer closed loop magnetic pole circumscribes the inner closed loop magnetic pole and wherein the inner closed loop magnetic pole circumscribes the central closed loop magnet pole.

3. The apparatus of claim 1, wherein the first body comprises a counterweight.

4. The apparatus of claim 1, wherein the plurality of first magnets is arranged in an array.

5. The apparatus of claim 4, wherein the plurality of first magnets comprise a north pole facing a target assembly within the process chamber.

6. The apparatus of claim 5, wherein the array comprises a first row, a second row, a third row and a fourth row.

7. The apparatus of claim 6, wherein each of the first row, second row, third row and fourth row comprise seven magnets.

8. The apparatus of claim 5, wherein the array comprises a first row having seven magnets and a second row having four magnets.

9. A process chamber, comprising:
    a chamber body defining a processing volume;
    a target assembly disposed atop the chamber body, the target assembly having a source distribution plate opposing a back surface of a target and electrically coupled to the target along a peripheral edge of the target; and
    a rotatable magnetron disposed within the target assembly and proximate the back surface of the target, the rotatable magnetron comprising:
        a support member having a first side and a second side coupling a first end to a second end and an axis of rotation between the first end and the second end;
        a first body coupled to the first end of the support member and extending away from the first side of the support member, wherein the first body has a plurality of first magnets coupled to a bottom of the first body, and wherein all magnets coupled to the first body are disposed on the first side of the support member; and
        a second body rotatably coupled to the second end of the support member and extending away from the second side of the support member, wherein the second body has a plurality of second magnets coupled to a bottom of the second body, and wherein the plurality of the first magnets are disposed about 180 degrees from the plurality of second magnets with respect to the axis of rotation of the support member, and wherein the axis of rotation is disposed between the first body and the second body.

10. The process chamber of claim 9, wherein the plurality of second magnets comprise an outer closed loop magnetic pole, an inner closed loop magnetic pole, and a central closed loop magnetic pole, wherein the outer closed loop magnetic pole circumscribes the inner closed loop magnetic pole and wherein the inner closed loop magnetic pole circumscribes the central closed loop magnet pole.

11. The process chamber of claim 9, wherein the first body comprises a counterweight.

12. The process chamber of claim 9, wherein the plurality of second magnets is arranged in an array.

13. The process chamber of claim 12, wherein the plurality of second magnets comprise a north pole facing a target assembly within the process chamber.

14. The process chamber of claim 13, wherein the array comprises a first row, a second row, a third row and a fourth row.

15. The process chamber of claim 14, wherein each of the first row, second row, third row and fourth row comprise seven magnets.

16. The process chamber of claim 12, wherein the array comprises a first row having seven magnets and a second row having four magnets.

17. An apparatus for forming a magnetic field within a process chamber, comprising:
    a support member having a first side and a second side coupling a first end to a second end and an axis of rotation between the first end and the second end;
    a first body coupled to the first end of the support member and extending away from the first side of the support member, wherein the first body comprises a counterweight and comprises a plurality of first magnets arranged in an array and coupled to a bottom of the first body, and wherein all magnets coupled to the first body are disposed on the first side of the support member; and
    a second body rotatably coupled to the second end of the support member and extending away from the second side of the support member, wherein the second body has a plurality of second magnets coupled to a bottom of the second body, and wherein the plurality of the first magnets are disposed about 180 degrees from the plurality of second magnets with respect to the axis of rotation of the support member, and wherein the axis of rotation is disposed between the first body and the second body, and wherein the plurality of second magnets comprises an outer closed loop magnetic pole, an inner closed loop magnetic pole, and a central closed loop magnetic pole, and wherein the outer closed loop magnetic pole circumscribes the inner closed loop magnetic pole and wherein the inner closed loop magnetic pole circumscribes the central closed loop magnet pole.

18. The apparatus of claim 17, wherein the plurality of first magnets comprise a north pole facing a target assembly within the process chamber.

19. The apparatus of claim 17, wherein the array comprises one of: (a) a first row, a second row, a third row and a fourth row, wherein each of the first row, second row, third row and fourth row comprise seven magnets, or (b) a first row having seven magnets and a second row having four magnets.

20. An apparatus for forming a magnetic field within a process chamber comprising:
- a support member having a first side and a second side coupling a first end to a second end and an axis of rotation between the first end and the second end;
- a first body coupled to the first end of the support member and extending away from the first side of the support member, wherein the first body has a plurality of first magnets coupled to a bottom of the first body;
- a second body rotatably coupled to the second end of the support member and extending away from the second side of the support member, the second body comprising;
- a pivot plate supported beneath the second end of the support member through the rotation bearing;
- a spring coupled to the support member and the pivot plate to bias the pivot plate to rotate toward the support member;
- a pair of stops coupled to the pivot plate on opposite sides of the support member to limit rotation of the pivot plate with respect to the support member in both the clockwise and counterclockwise directions; and
- a plurality of second magnets coupled to a bottom of the second body, and wherein the plurality of the first magnets are disposed about 180 degrees from the plurality of second magnets with respect to the axis of rotation of the support member;

and a rotation bearing rotatably coupling the second body to the second end of the support member.

* * * * *